(12) United States Patent
Racz et al.

(10) Patent No.: US 7,250,839 B2
(45) Date of Patent: Jul. 31, 2007

(54) MAGNETOSTRICTIVE THIN FILM ACTUATOR

(75) Inventors: Livia M. Racz, Belmont, MA (US); Chandrashekhar H. Joshi, Bedford, MA (US)

(73) Assignee: Energen, Inc., Lowell, MA (US)

( * ) Notice: Subject to any disclaimer, the term of this patent is extended or adjusted under 35 U.S.C. 154(b) by 168 days.

(21) Appl. No.: 10/914,469

(22) Filed: Aug. 9, 2004

(65) Prior Publication Data

US 2006/0028309 A1    Feb. 9, 2006

(51) Int. Cl.
*H01F 7/00* (2006.01)
*H01H 55/00* (2006.01)

(52) U.S. Cl. .................................... 335/215

(58) Field of Classification Search ........... 335/215; 137/831; 251/129.06; 310/26
See application file for complete search history.

(56) References Cited

U.S. PATENT DOCUMENTS 5,588,466 A * 12/1996 Benz et al. ............... 137/831

OTHER PUBLICATIONS

Kapton, Jun. 2006, www.wikipedia.org.*

* cited by examiner

*Primary Examiner*—Ramon M. Barrera
(74) *Attorney, Agent, or Firm*—Sam Pasternack; Choate Hall & Stewart LLP

(57) ABSTRACT

Magnetostrictive actuator. The actuator includes a flexible substrate and a magnetostrictive film on the substrate. The shape of the flexible substrate is altered in the presence of a magnetic field.

6 Claims, 2 Drawing Sheets

FIG.1a     FIG.1b     FIG.1c
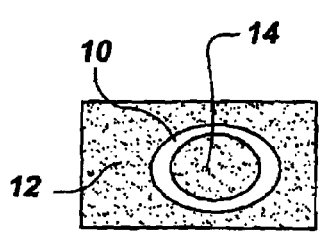 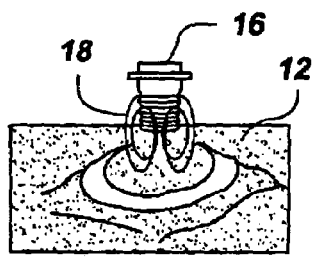 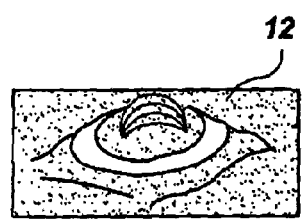
FIG.2a
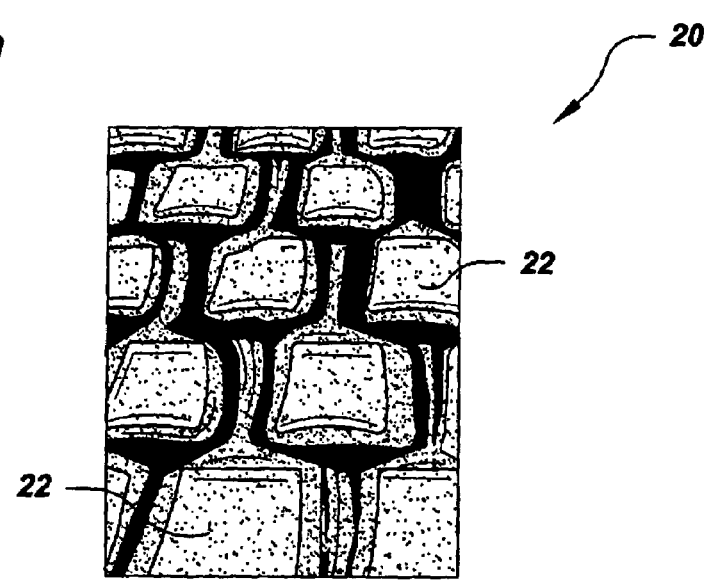
FIG.2b     FIG.2c
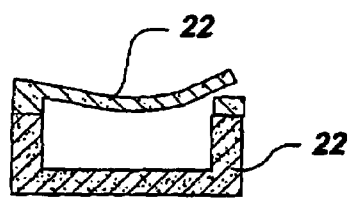 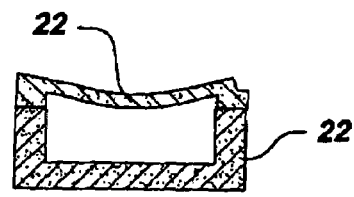

MAGNETOSTRICTIVE THIN FILM ACTUATOR

BACKGROUND OF THE INVENTION

This invention relates to micro- and nano-switching actuators employing magnetostrictive films.

Switches, adaptive optics, and MEMS devices require actuators for their operation. There are several known actuator technologies that can be used for these applications. Thermal actuation utilizes bimorphs, laminate structures made up of two materials having dissimilar coefficients of thermal expansion. As bimorphs are heated, the differential thermal expansion causes a bending motion. Thermal actuation, however, is plagued by slow response and control difficulties when operating conditions of the system are not isothermal. Further, there is no opportunity for a long-term shape memory effect.

Electrostatic actuation is another modality. Voltages are applied to structures to cause them to move. Electrostatic actuation is the most common actuation method for MEMS devices. While electrostatic actuation is very well understood, there are several disadvantages. First of all, electrostatic actuators require significant applied voltage requiring careful design to avoid an instability that occurs when the applied voltage is increased beyond a critical value. This instability is known as "snap-down". Once the critical value is exceeded, there is no longer a steady-state configuration of the device such that an actuated portion and a substrate remain separated. Further, the control of electrostatic actuators requires wires that impose difficult space constraints as devices shrink in size and there is no opportunity for remote control or for long-term shape memory effect.

Piezoelectric actuation is another very common actuation modality. As is well known, piezoelectric materials deform under an applied voltage to provide actuation. These actuators require a significant applied voltage and cannot be actuated remotely. There are also space constraints because of the need for wires and/or electrical traces. As with electrostatic actuation, piezoelectric methods cannot provide for long-term shape memory effect. Some piezoelectric materials are polymers that require moisture to operate. Their applicability is therefore limited and varies with environmental conditions.

Shape memory alloys have also been used for actuators. Shape memory materials undergo a martensitic transformation when heated, cooled or under an applied magnetic field. Such actuators offer slow response, can be difficult to control when operating conditions are not isothermal and impose constraints on operating temperatures.

Microfluidics flow control is another area requiring micro and/or nano-control. The most common forms of flow control in microfluidic devices are either passive, allowing droplets of fluid to flow through channels and mix diffusively, or based on pneumatic valves that flex under pressure. The advantage of passive flow control is that it is very robust because there are no moving parts and no active intervention. A main disadvantage, however, is that diffusive mixing is slow. Mixing of fluid streams in such a device can be on the order of minutes which severely limits through-put of material.

A pneumatic valve system, on the other hand, enables channel designs with rapid mixing. Such pneumatic valves are often made of an elastomer such as poly(dimethylsiloxane) (PDMS). Bladder-like areas of PDMS are inflated and deflated using applied pressure. There are, however, severe design restrictions. For example, each valve or array of valves connected to a single pressure manifold is constrained to open and close as a function of pressure drop. This means that if the channels to be controlled are the same length, all valves will actuate at the same time. To circumvent this limitation, channel lengths must be either designed as a function of pressure drop rather than optimized for the application, or separate pressure manifolds must be used for different channels requiring additional connections to the outside world and constraining the size of the device. See, for example, "Protein Crystalization Enabled by the NanoFlex™ Valve," Fluidigm Corporation, 2004, http://www.fluidigm.com.

Parallel-plate electrostatic valves have also been used for microfluidics flow control. These are typical MEMS actuators that bend under an applied voltage. See, for example, "Microvalves," Boston Micromachines Corporation, 2004, http://www.bostonmachines.com/products/micro valves.htm. Parallel-plate electrostatic valves are actuated electrostatically and therefore require on-chip power and there is no long-term memory so that power must be applied continuously to keep a valve actuated. Further, a parallel-plate electrostatic actuator is susceptible to "snap-down" as discussed earlier. This phenomenon severely restricts the range of stable operation of such valves and places size restrictions on the device.

Space inflatable structures such as solar sails, radar-based applications and optical mirrors require actuators for shape control. For externally reacted actuators, shape change is effected by positioning macroscopic actuators of any type behind a membrane of the structure. Precise control is effected by pushing on the membrane with the appropriate actuator in the appropriate location in response to a control signal. Alternatively, internally-reacted actuation is achieved by integrating into or onto the membrane a material that changes shape in response to a stimulus. See, E. M. Flint and K. K. Denoyer, "Approach for efficiently evaluating internally reacted global shape control actuation strategies for apertures," $44^{th}$ AIAA/ASME/ASCE/AHS Structures, Structural Dynamics, and Materials Conf, Norfolk, Va. April 2003.

Space inflatable structures have also been controlled with piezoelectric patches, small localized patches of material such as lead zirconate titanate (PZT) attached to polymer membranes in a selected control pattern. The PZT is then actuated by an applied voltage.

Shape control for space inflatable structures is also known using photostrictive materials actuated by shining light onto them such as from a laser. Photostrictive materials have disadvantages because relaxation response is very slow, and for materials of faster relaxation response, the achieved strain is very small. Further, localized heating resulting from the applied light may overwhelm the photostrictive response. Finally, photostrictive actuators need to be within line of sight of the controlled light source.

Shape memory alloys have also been used for space inflatable structure applications and are usually actuated by temperature change.

Electroactive polymer (EAP) bimorphs are also known for this application. These actuators are polymeric piezoelectric materials that can be poured onto a membrane and cured. An example of such a material is polyvinylidene fluoride (PVDF). It is often patterned to make a control pattern similar to other methods. See, D. M. Sobers, G. S. Agnes, D. Mollenhauer, "Smart Structures for Control of Optical Surfaces," $44^{th}$ AIAA/ASME/ASCE/AHS Structures, Structural Dynamics, and Materials Conf., Norfolk, Va. April 2003.

There is therefore a need for actuators for use in the above-mentioned applications that have fewer disadvantages than the actuators known in the prior art.

SUMMARY OF THE INVENTION

In one aspect, the actuator of the invention includes a flexible substrate with a magnetostrictive film on the substrate. Apparatus is provided for applying a magnetic field to the magnetostrictive film whereby the shape of the flexible substrate is altered. In another aspect, the actuator further includes a layer of a hard magnetic material on the magnetostrictive film to provide long-term shape memory. In a preferred embodiment, the magnetic field is provided by an electromagnetic coil. Suitable magnetostrictive material comprises any ferromagnetic element such as Ni, Fe, or Co, any ferrous alloy such as Fe—Co or Fe—Ga—Al, any rare earth compound such as $Fe_2Tb$, $Fe_2Dy$, $Tb_xDy_{1-x}$, $Tb_{1-x}Dy_xZn$, or any ferromagnetic shape memory alloy (FSMA) such as Fe—Pd or Ni—Mn—Ga. Suitable hard magnetic materials include NiFe, AlNiCo or $Fe_2O_3$. A suitable flexible substrate is Kapton, CP-1, Upilex, or thin glass.

In yet another aspect, the invention is a sensor microarray including an array comprising a plurality of reservoirs with each reservoir containing a chemical sensor. A membrane cover is provided for each reservoir. The membrane cover includes a flexible substrate with a magnetostrictive layer and a hard magnetic material layer such that the membrane cover either opens or closes the reservoir in response to a magnetic field. In a preferred embodiment, the sensor microarray detects airborne compounds such as bio-toxins. It is preferred that the membrane cover be asymmetrically tethered on the reservoir.

In yet another aspect, the invention is a microfluidic valve including a valve body and a flexible membrane cooperating with the valve body for blocking flow in one configuration and for allowing flow in another configuration. The flexible membrane includes a magnetostrictive layer so that the flexible membrane changes from one configuration to the other in response to a magnetic field. In a preferred embodiment, a hard magnetic material layer cooperates with the magnetostrictive layer to provide long-term shape memory for the valve.

In yet another aspect, the invention is a variable width microfluidic channel having at least one wall coated with a magnetostrictive material so that channel width varies in response to an applied magnetic field. In a preferred embodiment of this aspect of the invention, the magnetostrictive coating is patterned along the channel walls. The magnetic field may be varied at a desired frequency to enhance fluid mixing in the channel.

In yet another aspect, the invention is a space-deployable structure including polymer membranes adapted to be inflated or opened in space to assume a desired configuration and magnetostrictive film selectively deposited on the polymer membranes to change the shape of the flexible structure in response to an applied magnetic field. The desired configuration may include solar sails, a radar reflector or an optical mirror.

The actuators and devices based on the actuators of the invention have advantages not present in the prior art actuators discussed above. For example, the actuators of the invention may be actuated remotely. Actuation uses low voltages as used in microchips and these actuators provide for a long-term shape memory effect, in which power does not have to be applied continuously to preserve the shape change. The unique attributes of the actuators of the invention have applications spanning many length scales in fields as diverse as inflatable space structures, microfluidics lab-on-a-chip applications, bio-toxin detection systems, and many other applications apparent to those of ordinary skill in the art.

BRIEF DESCRIPTION OF THE DRAWING

FIG. 1a is a schematic diagram of shape control in a smart magnetic film stack having a nominally flat substrate with deposited films.

FIG. 1b is a schematic diagram of shape control with a magnetic field applied locally to the stack.

FIG. 1c is a schematic diagram of shape control showing that a hard magnetic layer remains magnetized.

FIG. 2a is a schematic illustration of a wearable bio-toxin sensor microarray.

FIG. 2b is a schematic illustration of a cross section of a reservoir in the open configuration and having an asymmetrically tethered membrane cover.

FIG. 2c is a schematic illustration of a cross section of a reservoir that is closed.

DESCRIPTION OF THE PREFERRED EMBODIMENTS

Figure 3A:
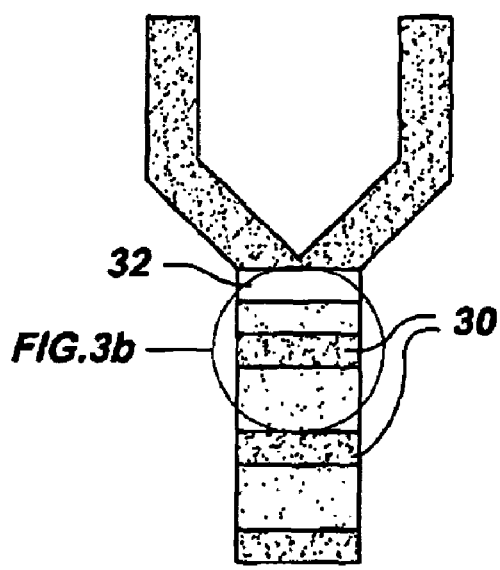
FIG. 3a is a schematic diagram of a micro-fluidic channel with patches of magnetostrictive film on the channel bottom.

Magnetostrictive smart materials (MSM) change their length when a magnetic field is applied or generate a magnetic field in response to applied pressure. The present invention is based on their potential for use in thin film actuators. They are often referred to as "smart materials" because they convert a form of energy into motion. Other smart materials include electroactive polymers, magnetic and thermal shape memory alloys, and piezoelectric ceramics. Each of them directly converts electrical, magnetic or thermal energy into motion. Because of these properties, smart materials are very attractive for the development of micro-actuators.

Magnetic smart materials have two key advantages over most other smart materials. The first is that that they can be activated remotely. Unlike electrostatically actuated devices, which require electrical contracts, traces, and an on-chip power source, magnetically actuated devices can be put on chips without a power requirement. Since the actuation mechanism can be a separate device that applies a magnetic field, smart magnetic devices can be made very small and at low cost.

A second advantage of magnetic smart materials is that by taking advantage of the unique properties of multi-layer thin films, one can design an actuator with zero power hold capability. For example, by coating a hard magnetic material over a magnetostrictive layer and magnetizing the hard magnetic material layer locally with an external field, it is possible to obtain a localized deformation of the magnetostrictor without continuous application of power. Therefore, after the hard magnetic material has been magnetized with the local field, the deformation of the magnetostrictor remains after the external field is extinguished. Suitable magnetostrictive materials for use in the present invention include alloys that produce large strain such as $Fe_2Tb$, $Fe_2Dy$, TbDy, and TbDyZn. When only small strain is needed and cost or ease of deposition are critical, elemental materials such as Ni may be used. The permanent (hard) magnetic material can be NiFe, AlNiCo, $Fe_2O_3$, or one of many other permanent magnetic materials apparent to those of skill in the art.

With reference now to FIG. 1a, a magnetostrictive material 10 is supported on a flexible substrate 12. A layer 14 of a hard magnetic material is carried on the magnetostrictive material 10. As shown in FIG. 1b, an electromagnetic coil 16 generates a magnetic field 18 which causes the magnetostrictive layer 10 to expand and the hard magnetic layer 14 to become magnetized. The shape of the substrate 12 changes as a result of the expansion of the magnetostrictive layer 10. FIG. 1c shows that the hard magnetic layer 14 remains magnetized and continues to apply a magnetic field (usually weaker than the applied field) to the magnetostrictive material 10. The desired shape change in the underlying substrate 12 remains. Those skilled in the art will appreciate that the electromagnetic coil 16 may be activated by an off-chip power source allowing the actuator to be activated remotely. It will also be noted that if the technology were applied to a switch, valve or gate, the device would remain in its actuated state until a reverse-magnetizing field is applied to change the shape back to its original configuration.

Those skilled in the art will appreciate that the magnetostrictive material 10 and the magnetic material 14 may be deposited as thin films by techniques well known to those of ordinary skill in the art, such as sputtering, thermal evaporation, chemical vapor deposition, electroplating, or thick film methods such as screenprinting.

The combination of remote actuation and zero power hold capability provided by the structure of FIG. 1 opens up a nearly limitless horizon for MSM microactuators and smart films. One such application is a low cost, disposable multi-agent detector for chemicals and bio-toxins that can be worn like a button by humans. As shown in FIG. 2a, such a detector 20 includes an array of micro reservoirs 22 each containing a specific chemical sensor. As shown in FIG. 2b, each reservoir 22 has a "micro-lid" 24 asymmetrically tethered from the reservoir 22. The lid 24 includes a flexible membrane coated with smart films and a hard magnetic layer as illustrated in FIG. 1.

In operation, the array 20 has the reservoirs 22 opened in a laboratory and distributed to personnel to be monitored. Thereafter, the reservoirs are closed at a collection point upon the application of an external magnetic field and the reservoir is processed and analyzed at a later time to determine exposure to toxins, for example, in a specified time period. FIG. 2c shows a closed reservoir 22.

Another application of the structures disclosed herein is in the field of microfluidics. Microfluidics is the branch of nanotechnology dealing with control of fluid on the order of nanoliters or less. As discussed earlier in this specification, prior art forms of flow control have disadvantages. Flow control based on magnetic smart materials allow for microfluidic devices to remain passive, small and inexpensive, with low voltage operation using an off-chip power source. They will provide much improved design flexibility over pneumatic valves and greater control over fluid flow than electrostatic valves. Those skilled in the art will appreciate that the structure illustrated in FIGS. 2b and 2c is readily adapted to serve as a microfluidic valve controlled remotely by externally applied magnetic fields.

Figure 3B:
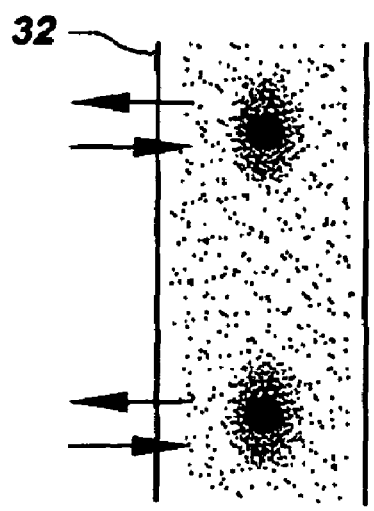
FIG. 3b is a side view of a portion of a channel with two patches of magnetostrictive material film.

Yet another microfluidics application involves active control over the width of channels through which fluids flow and therefore control over the flow rate or pressure drop. By patterning MSM along channel walls and actuating the MSM at a desired frequency, one can obtain better and faster fluid mixing than has been possible to date. As shown in FIG. 3a, smart film patches 30 are deposited on a channel wall of a microchannel 32. FIG. 3b shows actuation of the film and the resultant mixing as a result of swirling flow.

Figure 4:
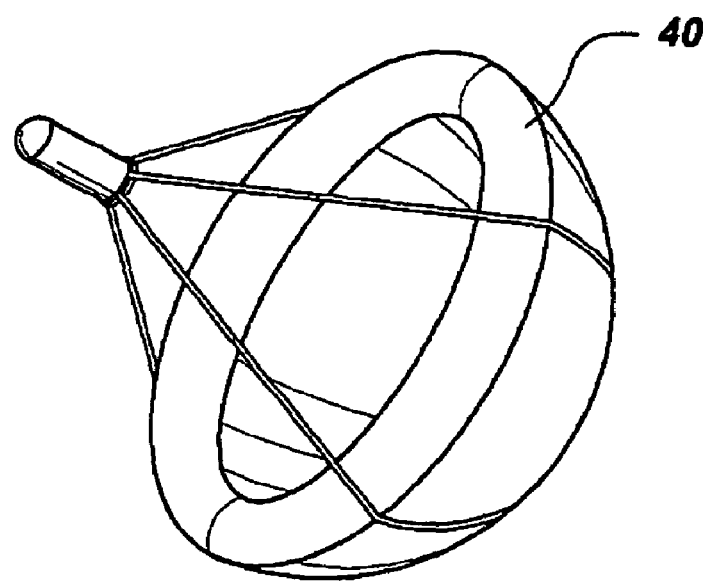
FIG. 4 is a perspective view of a space inflatable antenna.

Another application of the smart films disclosed herein that bridges the nanoscale with the macroscale is shape control of space-deployable structures. Such structures comprise polymer membranes such as Kapton, CP-1, or Upilex, or very thin glass layers, and are combined ideally with a conformal low-mass actuation and feedback mechanism that can monitor shape and change it actively after deployment of the structure. Examples of space-deployable structures utilizing the present invention include solar sails, radar-based applications and optical mirrors. Another example is a space inflatable antenna 40 shown in FIG. 4. Magnetic smart materials are particularly well suited to this application since they have been extensively tested in space environments. A suitable magnetic smart material for space applications is disclosed in U.S. Pat. No. 6,451,131 and known by the trademark KelvinAll. This material retains its magnetostrictive properties down to a temperature of 2° K. and has been successfully deposited in thin film form.

It is to be noted that different combinations of the films disclosed herein can achieve desired properties. Possible combinations include multi-layer film stacks that include passive materials, other smart materials or other magnetic materials.

The contents of all of the literature articles and patents cited herein are incorporated by reference.

It is recognized that modifications and variations of the inventions disclosed herein will occur to those skilled in the art and it is intended that all such modifications and variations be included within the scope of the appended claims.

What is claimed is:

1. Actuator or comprising:
   A flexible substrate;
   A magnetostrictive film on the substrate;
   A layer of a hard magnetic material disposed on the magnetostrictive film to provide long-term shape memory and zero-power hold capability; and
   Means for applying a magnetic field to the magnetostrictive film whereby the shape of the flexible substrate is altered.

2. The actuator of claim 1 wherein the means for applying the magnetic field comprises an electromagnetic coil.

3. The actuator of claim 1 wherein the magnetostrictive material comprises $Fe_2Tb$, $Fe_2Dy$, TbDy, TbDyZn or Ni.

4. The actuator of claim 1 wherein the hard magnetic material is NiFe, AlNiCo, or $Fe_2O_3$.

5. The actuator of claim 1 wherein the substrate is Kapton, CP-1 or Upilex.

6. Actuate or comprising:
   A flexible substrate; and
   A magnetostrictive film on the substrate whereby the shape of the flexible substrate is altered in the presence of a magnetic field, further including a layer of a hard magnetic material on the magnetostrictive film to provide zero-power hold capability.

* * * * *